United States Patent
Park et al.

(10) Patent No.: US 7,663,136 B2
(45) Date of Patent: Feb. 16, 2010

(54) METHOD OF MANUFACTURING AMORPHOUS NiO THIN FILMS AND NONVOLATILE MEMORY DEVICES USING THE SAME

(75) Inventors: Sung-Ho Park, Yongin-si (KR); Bum-Seok Seo, Yongin-si (KR); Myoung-Jae Lee, Suwon-si (KR); June-Mo Koo, Seoul (KR); Sun-Ae Seo, Hwaseong-si (KR); Young-Kwan Cha, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 244 days.

(21) Appl. No.: 11/505,968

(22) Filed: Aug. 18, 2006

(65) Prior Publication Data
US 2007/0065961 A1    Mar. 22, 2007

(30) Foreign Application Priority Data
Sep. 22, 2005    (KR) .................... 10-2005-0088236

(51) Int. Cl.
*H01L 29/06* (2006.01)
(52) U.S. Cl. .................................. 257/5; 257/E45.001
(58) Field of Classification Search .................. 438/3; 365/163; 257/E21.662, E21.663, E45.001, 257/5; 427/255.31
See application file for complete search history.

(56) References Cited

U.S. PATENT DOCUMENTS

| | | | |
|---|---|---|---|
| 6,124,158 A * | 9/2000 | Dautartas et al. | 438/216 |
| 6,482,740 B2 * | 11/2002 | Soininen et al. | 438/686 |
| 7,196,955 B2 * | 3/2007 | Nickel | 365/211 |
| 2004/0135184 A1 * | 7/2004 | Motoyoshi | 257/295 |
| 2005/0103269 A1 * | 5/2005 | Sneh | 118/715 |
| 2005/0201173 A1 * | 9/2005 | Sharma et al. | 365/218 |
| 2006/0207503 A1 * | 9/2006 | Meneghini et al. | 118/715 |
| 2007/0277735 A1 * | 12/2007 | Mokhlesi et al. | 118/723 R |

OTHER PUBLICATIONS

M. Ultriainen, et al. "Studies of NiO Thin Film Formation by Atomic Layer Epitaxy", Elsevier Materials Science & Engineering B54, dD(1998(, pp. 98-103.*

H. Kumagai et al "Preparation and characteristics of nickel oxide thin film by controlled growth with sequential surface chemical reactions", Journal of Materials Science Letters vol. 15, (1996), pp. 1081-1083.*

* cited by examiner

*Primary Examiner*—Caridad M Everhart
(74) *Attorney, Agent, or Firm*—Harness, Dickey & Pierce, PLC

(57) ABSTRACT

Example embodiments relate to a method of manufacturing amorphous NiO thin films and nonvolatile memory devices including amorphous thin films that use a resistance material. Other example embodiments relate to a method of manufacturing amorphous NiO thin films having improved switching and resistance characteristics by reducing a leakage current and non-volatile memory devices using an amorphous NiO thin film. Provided is a method of manufacturing an amorphous NiO thin film having improved switching behavior by reducing leakage current and improving resistance characteristics. The method may include preparing a substrate in a vacuum chamber, preparing a nickel precursor material, preparing a source gas by vaporizing the nickel precursor material, preparing a reaction gas, preparing a purge gas and forming a monolayer NiO thin film on the substrate by performing one cycle of sequentially supplying the source gas, the purge gas, the reaction gas and the purge gas into the vacuum chamber.

6 Claims, 8 Drawing Sheets

(a) ALD (b) Sputter

METHOD OF MANUFACTURING AMORPHOUS NIO THIN FILMS AND NONVOLATILE MEMORY DEVICES USING THE SAME

PRIORITY STATEMENT

This application claims priority under 35 U.S.C. § 119 to Korean Patent Application No. 10-2005-0088236, filed on Sep. 22, 2005, in the Korean Intellectual Property Office (KIPO), the entire contents of which are incorporated herein by reference.

BACKGROUND

1. Field

Example embodiments relate to a method of manufacturing amorphous NiO thin films and nonvolatile memory devices including amorphous thin films that use a resistance material. Other example embodiments relate to a method of manufacturing amorphous NiO thin films having improved switching and resistance characteristics by reducing a leakage current and non-volatile memory devices using an amorphous NiO thin film.

2. Description of the Related Art

FRAMs, MRAMs, and PRAMs are nonvolatile memory devices that may use a conventional resistance material. While DRAMs or flash memories store binary information using an electric charge, FRAMs may use the polarization of a ferroelectric material. MRAMs may use the resistance change of a magnetic tunnel junction (MTJ) thin film according to the magnetization state of the ferromagnetic material and PRAMs may use the resistance change according to a phase change. FRAMs, MRAMs, and PRAMs are devices that may replace conventional volatile and nonvolatile memory, because FRAMs, MRAMs, and PRAMs may have both higher integration characteristics common to DRAMs and the nonvolatile characteristics of flash memories.

A phase-change RAM (PRAM) may be an example of a nonvolatile memory device and may store binary information using the phase change characteristics of a phase change material (e.g., GeSbTe (GST)). The phase of GST may change into a crystalline state and/or an amorphous state by localized electrical pulse heating. The PRAM may include a memory cell having a phase change layer, a resistor and a switch transistor. The phase change layer may be formed of a GST based material (e.g., chalcogenide). The purpose of the resistor may be to heat the phase change layer. The phase change layer may change the phase into a crystalline state and/or an amorphous state according to the degree of heating. The crystalline state and the amorphous state may have different resistance. The state may determine the voltage and current across the phase change layer, to allow storing and reading of binary information using the resistance difference.

FIG. 1 is a diagram illustrating a nonvolatile memory device that uses a crystalline NiO thin film manufactured using a conventional sputtering method. FIG. 2 is a graph showing the switching behavior of the crystalline NiO thin film of FIG. 1. FIG. 3 is a graph showing the resistance characteristics of a crystalline NiO thin film formed to a thickness of 200 Å using a conventional sputtering method.

Referring to FIG. 1, a nonvolatile memory device that uses a NiO thin film may include a transistor switch 20 and a data storage unit 28 connected to the transistor switch 20. The transistor switch 20 may include a source 12s, a drain 12d, a channel 12c and a gate electrode 14. The data storage unit 28 may include an upper electrode 26, a lower electrode 24 and a NiO thin film 25 interposed therebetween. An insulating layer 30 may be formed on the transistor switch 20 and the data storage unit 28 may be located in the insulating layer 30. The data storage unit 28 may be connected to the transistor switch 20 via a conductive contact plug 22.

The conventional NiO thin film 25 resistance material may be formed by sputtering and the NiO thin film 25 formed in this way may be polycrystalline. Reducing the reset current may be limited, because the NiO thin film 25 may have a larger leakage current and poorer resistance characteristics. To have a switching characteristic in a non-volatile memory device when the crystalline NiO thin film 25 is used as a resistance in the nonvolatile memory device, the crystalline NiO thin film 25 may be formed relatively thick, for example, from about 500 Å to about 1000 Å. Higher integration of the memory device may become more difficult.

SUMMARY

Example embodiments relate to a method of manufacturing amorphous NiO thin films and nonvolatile memory devices including amorphous thin films that use a resistance material. Other example embodiments relate to a method of manufacturing amorphous NiO thin films having improved switching and resistance characteristics by reducing a leakage current and non-volatile memory devices using an amorphous NiO thin film.

According to example embodiments, there is provided a method of forming an amorphous NiO thin film that includes preparing a substrate in a vacuum chamber; preparing a nickel precursor material, preparing a source gas by vaporizing the nickel precursor material, preparing a reaction gas, preparing a purge gas and forming a monolayer NiO thin film on the substrate by performing one cycle of sequentially supplying the source gas, the purge gas, the reaction gas and the purge gas into the vacuum chamber.

The thickness of the NiO thin film may be controlled by repeatedly forming a monolayer NiO thin film on the substrate by performing one cycle of sequentially supplying the source gas, the purge gas, the reaction gas and the purge gas into the vacuum chamber. The substrate may be held at a temperature of about 200° C. to about 450° C. and the NiO thin film may be formed to a thickness of about 10 Å to about 499 Å. The reaction gas may be selected from the group including $O_3$ and $H_2O$. The nickel precursor material may be formed of a material selected from the group including $Ni(C_5H_5)_2$, $Ni(CH_3C_5H_4)$, $Ni(C_5H_7O_2)_2$, $Ni(C_{11}H_{19}O_2)_2$ and $Ni(C_7H_{16}NO)$. The vaporization temperature of the nickel precursor material may be held at about 150° C. The forming of a monolayer NiO thin film on the substrate by performing one cycle of sequentially supplying the source gas, the purge gas, the reaction gas and the purge gas into the vacuum chamber may include supplying the source gas in the vacuum chamber, supplying the purge gas after stopping the supply of the source gas, supplying the reaction gas after stopping the supplying of the purge gas and supplying the purge gas after stopping the supplying of the reaction gas. The source gas may be supplied for about 0.007 seconds and the purge gas may be supplied for about 5 seconds. The $H_2O$ reaction gas may be supplied for about 0.5 seconds and the $O_3$ reaction gas may be supplied for about 2 seconds. The purge gas may include one of $N_2$ and/or Ar.

According to other example embodiments, there is provided a non-volatile memory device including a transistor switch that may include a source, a drain, a channel and a gate electrode and a data storage unit that may include an amorphous NiO thin film interposed between a first electrode and a second electrode connected to the transistor switch. The amorphous NiO thin film may be formed to a thickness of about 10 Å to about 499 Å using an atomic layer deposition (ALD) process. The first and second electrodes may be formed of a metal (e.g., platinum (Pt) and/or any other suitable metal). The amorphous NiO thin film may include a plurality of sequentially formed monolayer NiO thin films.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

FIG. 1 is a diagram illustrating a nonvolatile memory device that uses a crystalline NiO thin film manufactured using a conventional sputtering method;

FIG. 2 is a graph illustrating the switching behavior of the crystalline NiO thin film of FIG. 1;

FIG. 3 is a graph illustrating the resistance characteristics of a crystalline NiO thin film formed to a thickness of about 200 Å using a conventional sputtering method;

FIG. 5 is a graph illustrating the resistance characteristics of an amorphous NiO thin film manufactured according to example embodiments;

FIG. 6 is a graph illustrating the switching behavior of an amorphous NiO thin film manufactured according to example embodiments;

FIG. 7 is a graph illustrating the result of XRD analysis of an amorphous NiO thin film manufactured according to example embodiments;

FIG. 8A-8B are SEM images of the surfaces of an amorphous NiO thin film manufactured according to example embodiments and a conventional sputtering method, respectively; and FIG. 9 is a diagram illustrating a nonvolatile memory device that uses an amorphous NiO thin film manufactured using an ALD process according to example embodiments.

DETAILED DESCRIPTION OF EXAMPLE EMBODIMENTS

Figure 1:
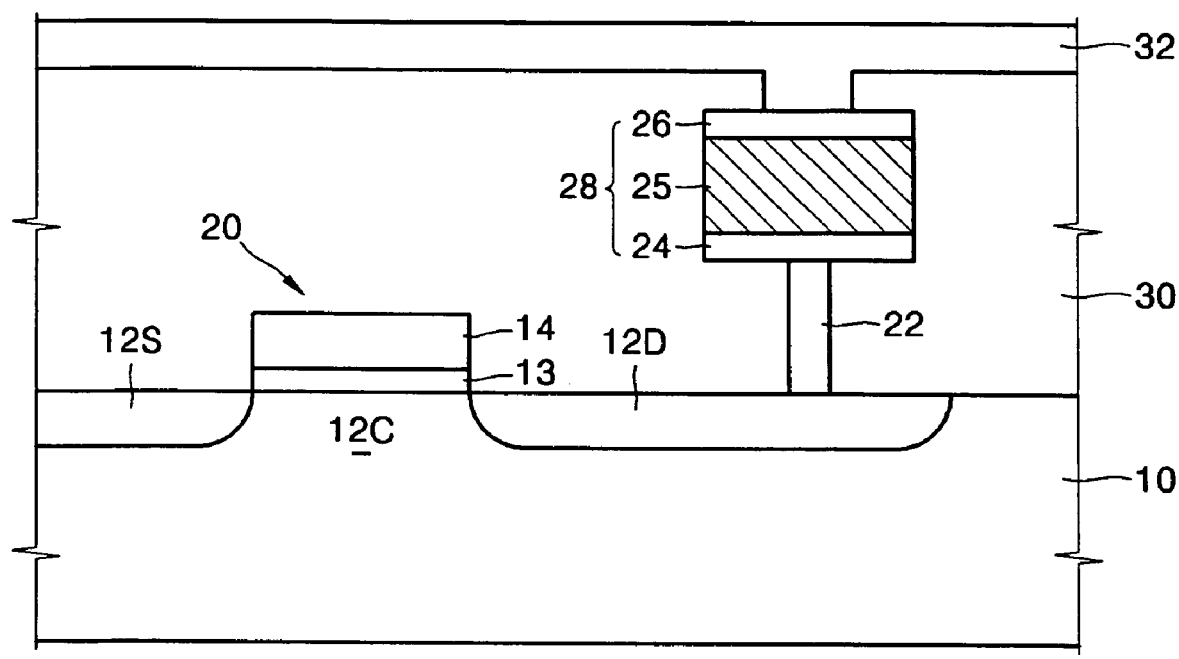
Figure 2:
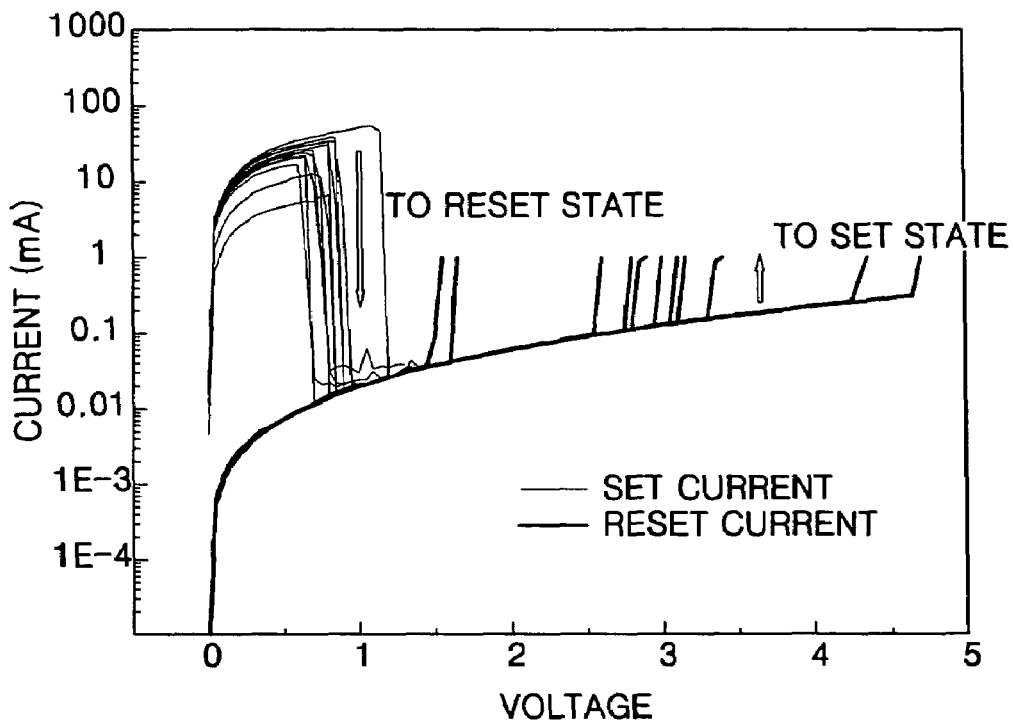
Figure 3:
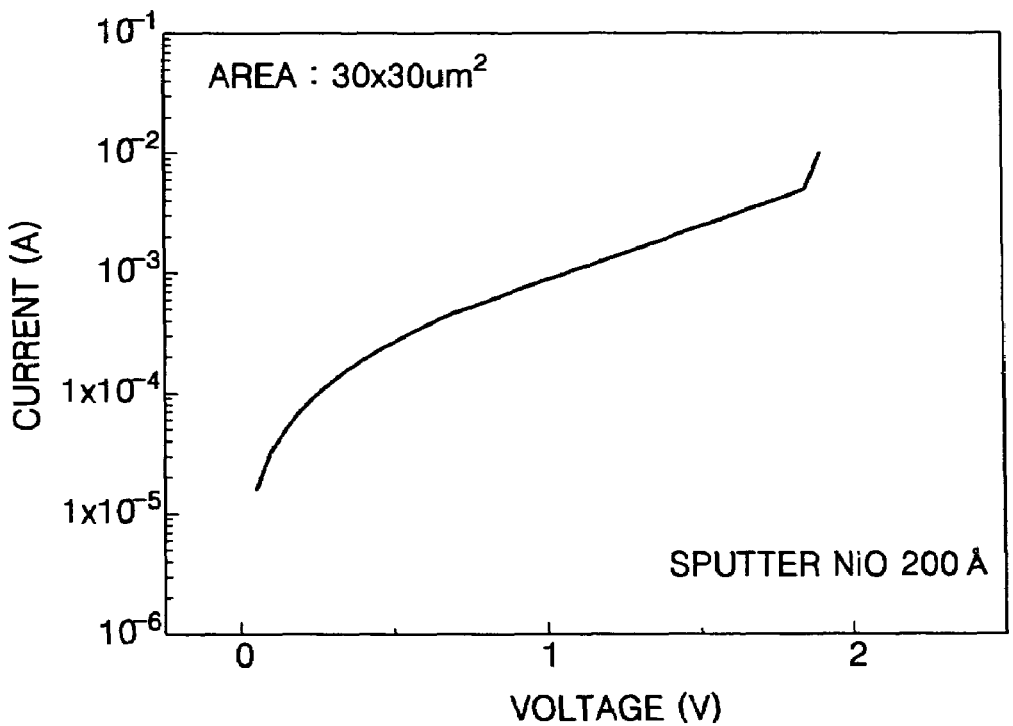

A method of manufacturing an amorphous NiO thin film and a non-volatile memory device that uses the amorphous NiO thin film, according to example embodiments, will now be described more fully with reference to the accompanying drawings. In the drawings, the thicknesses of layers and regions are exaggerated for clarity. Example embodiments should not be construed as being limited to the example embodiments set forth herein; rather, these example embodiments are provided so that this disclosure will be thorough and complete and will fully convey the concept to those skilled in the art. Like numbers refer to like elements throughout the description of the figures.

Detailed illustrative embodiments are disclosed herein. However, specific structural and functional details disclosed herein are merely representative for purposes of describing example embodiments. The embodiments may, however, be embodied in many alternate forms and should not be construed as limited to only the embodiments set forth herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to a method of manufacturing amorphous NiO thin films and nonvolatile memory devices including amorphous thin films that use a resistance material. Other example embodiments relate to a method of manufacturing amorphous NiO thin films having improved switching and resistance characteristics by reducing a leakage current and non-volatile memory devices using an amorphous NiO thin film.

Figure 4A:
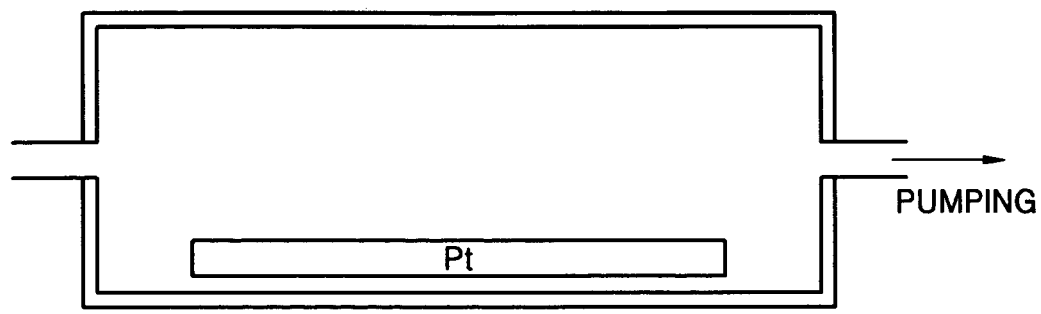
FIGS. 4A-4E are diagrams illustrating a method of manufacturing an amorphous NiO thin film using an ALD process according to example embodiments.

FIGS. 4A-4E are diagrams illustrating a method of manufacturing an amorphous NiO thin film using atomic layer deposition (ALD) according to example embodiments. ALD may be a deposition technique by which a plurality of atomic layers of a material may be deposited one by one on a substrate by alternately supplying a source gas and a reaction gas into a vacuum chamber. Referring to FIG. 4A, a substrate 70 may be prepared in a vacuum chamber 60. The substrate 70 may be held at a temperature of about 200° C. to about 450° C. After preparing a nickel precursor material (e.g., Ni(C$_5$H$_5$)$_2$, Ni(CH$_3$C$_5$H$_4$), Ni(C$_5$H$_7$O$_2$)$_2$, Ni(C$_{11}$H$_{19}$O$_2$)$_2$ and/or Ni(C$_7$H$_{16}$NO) [Ni(dmamb)$_2$; Nickel 1-dimethlamino-2methyl-2butanolate]), a gas source may be prepared by vaporizing the nickel precursor material using a vaporizer at about 150° C. A reaction gas which will react with the source gas may be selected using at least one of O$_3$ and H$_2$O. A purge gas that includes N$_2$ or Ar may be prepared.

Figure 4B:
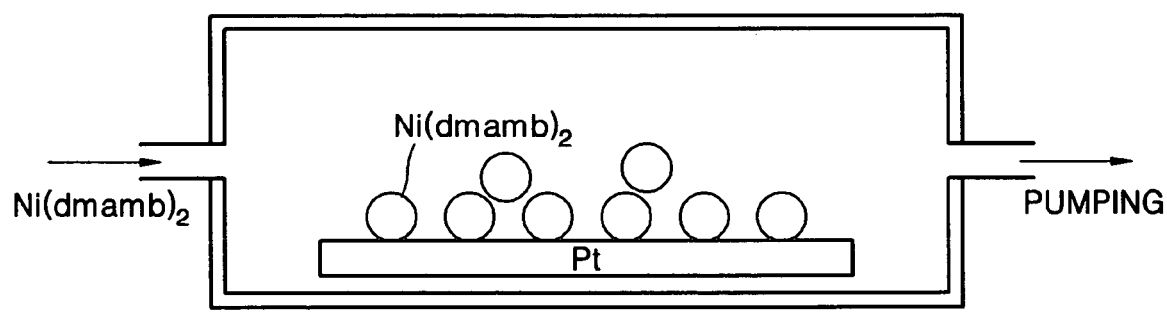
Figure 4C:
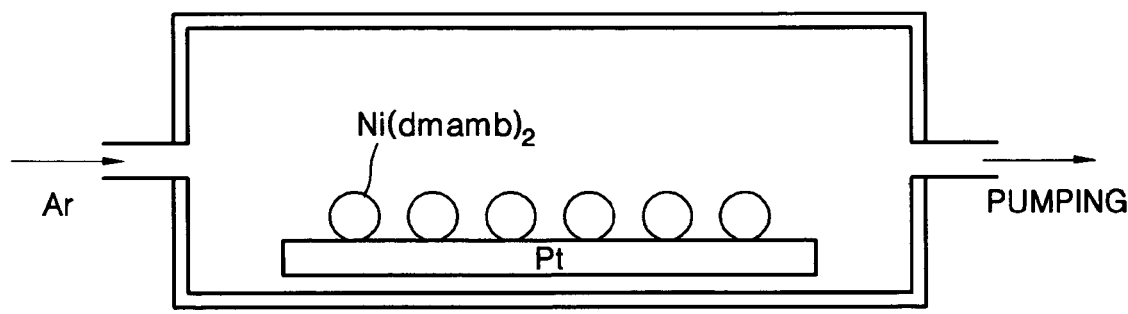
Figure 4D:
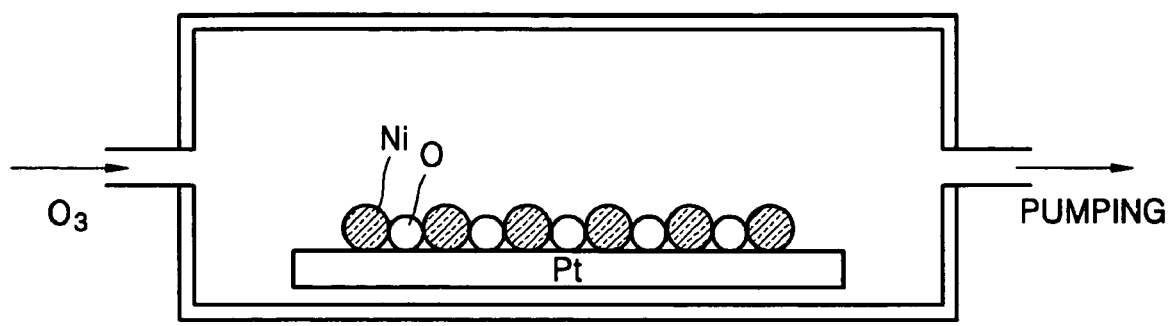
Figure 4E:
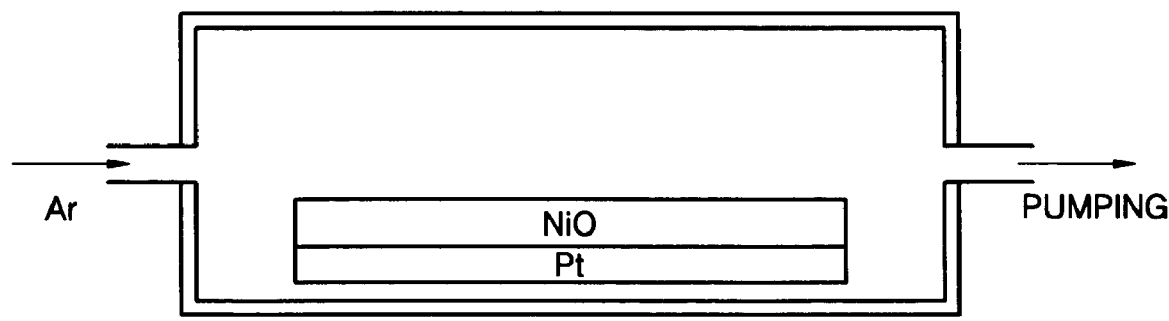

Referring to FIGS. 4B and 4E, a monolayer NiO thin film 80 may be formed on the substrate 70 by performing one cycle of sequentially supplying the source gas, the purge gas, the reaction gas and the purge gas into the vacuum chamber 60. The source gas may be supplied into the vacuum chamber 60 for about 0.007 seconds and the purge gas may be supplied for about 5 seconds after stopping the supply of the source gas. The reaction gas may be supplied after stopping the supply of the purge gas. At least one of O$_3$ and H$_2$O may be used as the reaction gas. When H$_2$O is used as the reaction gas, it may be supplied for about 0.5 seconds and when $O_3$ is used, it may be supplied for about 2 seconds. The purge gas may be supplied for about 5 seconds after stopping the supply of the reaction gas. Through this process, the amorphous NiO thin film 80 may be obtained on the substrate 70 and the thickness of the NiO thin film 80 may be controlled by the number of cycles. The NiO thin film 80 may be formed to a thickness of about 10 Å to about 499 Å.

The amorphous NiO thin film 80 obtained by this ALD process may have a lower leakage current and improved resistance characteristics. When the amorphous NiO thin film 80 is used for a nonvolatile memory device, the switching behavior of the nonvolatile memory device may be improved. The amorphous NiO thin film 80 may have improved switching behavior even at a relatively small thickness of about 200 Å and the thickness of the NiO thin film 80 may be readily controlled because it may be manufactured using ALD. When a nonvolatile memory device is manufactured using the method of manufacturing an amorphous NiO thin film 80, the integration of the memory device may be increased and the reset current required for writing and erasing data may be reduced.

Experiment

Figure 5:
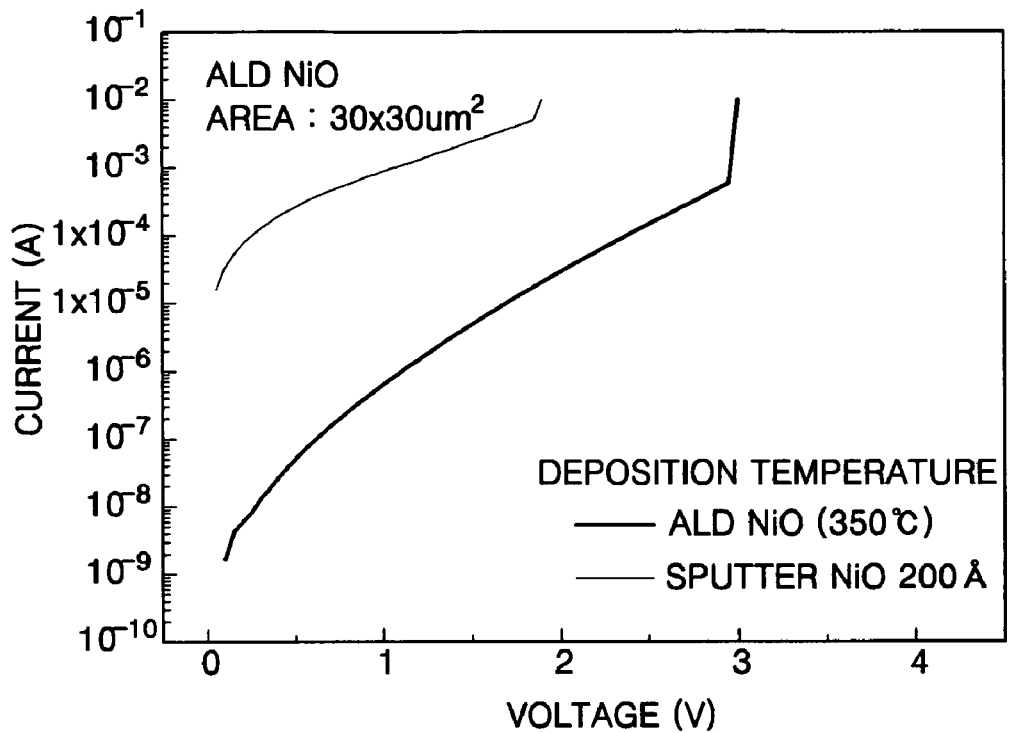
Figure 6:
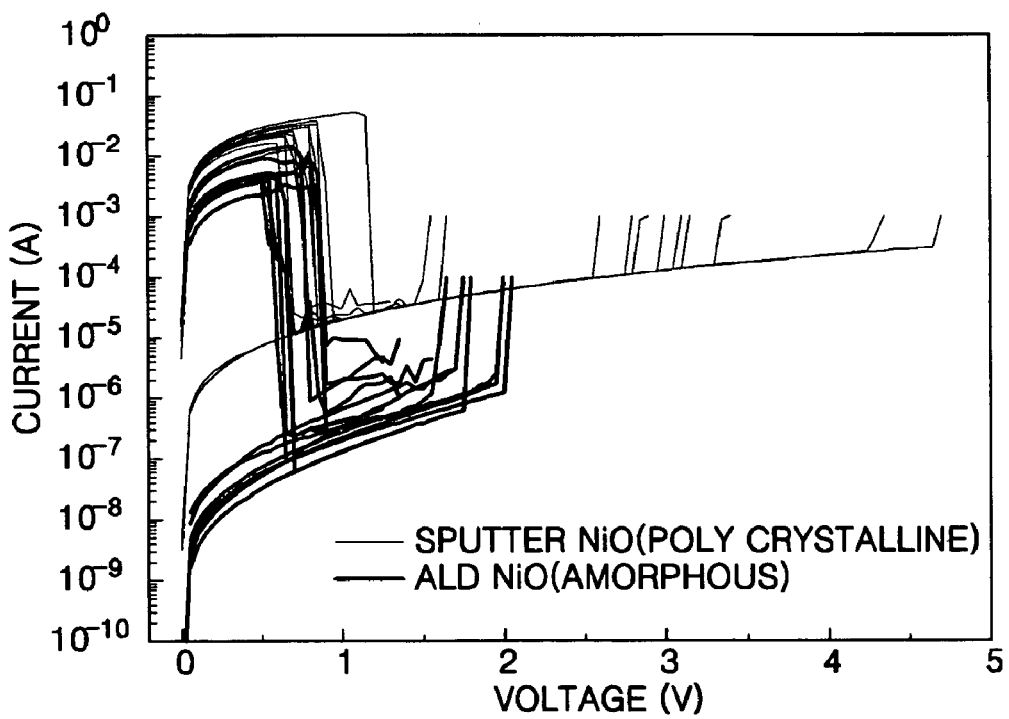

An NiO thin film 80 was deposited using atomic layer deposition (ALD) using Ni (dmamb)$_2$ as the source material and $O_3$ and $H_2O$ as the reaction gas. ALD may deposit only a mono-layer on a substrate by alternately supplying a source material and a reaction material over the substrate with a time lag and performing a purge process using an inert gas during the time lag. The process conditions used for the experiment were as follows. The substrate was held at a temperature of about 300° C. to about 450° C. The source material was vaporized using a vaporizer before being supplied over the substrate. The vaporizer was held at a constant temperature of about 150° C. The overall reaction process was that, after the source material was supplied over the substrate by injecting it into a chamber for about 0.007 seconds, a purge process was performed for about 5 seconds using Ar gas. $O_3$ and $H_2O$ were respectively supplied into the chamber for about 0.5 seconds and about 2 seconds as reaction gases. The first supply cycle was finished by again purging the Ar gas into the chamber. The NiO thin film was formed and the thickness of the NiO thin film was controlled by controlling the number of cycles. In example embodiments, the NiO thin film having a thickness of about 200 Å was obtained by performing 300 cycles. A wafer having a Si/SiO$_2$/Ti (thickness of 200 Å)/Pt (1000 Å) structure was used for depositing the NiO thin film using ALD. FIGS. 5 and 6 are graphs respectively showing the resistance characteristics and the switching behavior of an amorphous NiO thin film manufactured according to example embodiments. The light lines illustrate the resistance characteristics and switching behavior of a conventional sputtered crystalline NiO thin film for comparison. Referring to FIG. 6, the amorphous NiO thin film deposited by ALD has a lower reset current than the conventional crystalline NiO thin film, thereby improving the on-off ratio to more than twice that of the conventional art.

Figure 7:
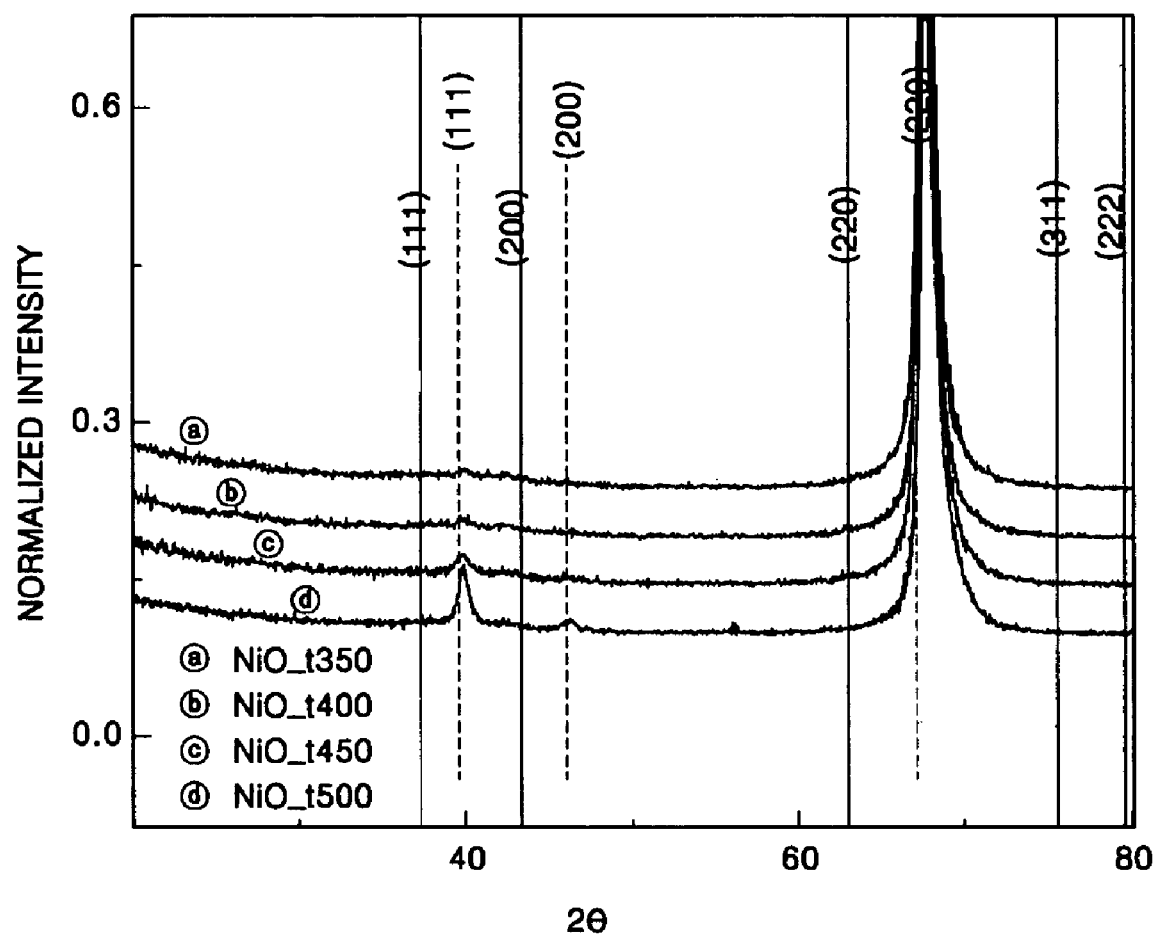
Figure 8:
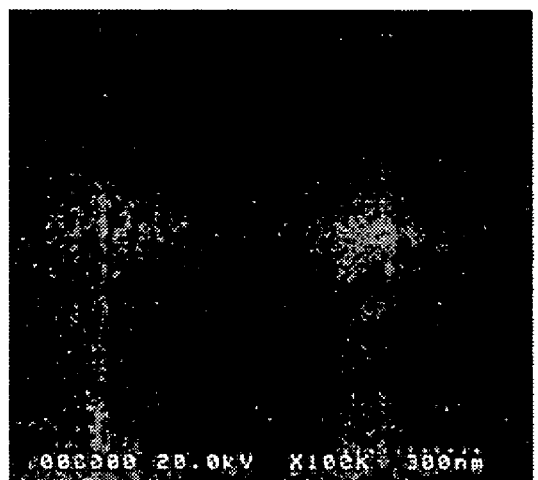
Figure 8:
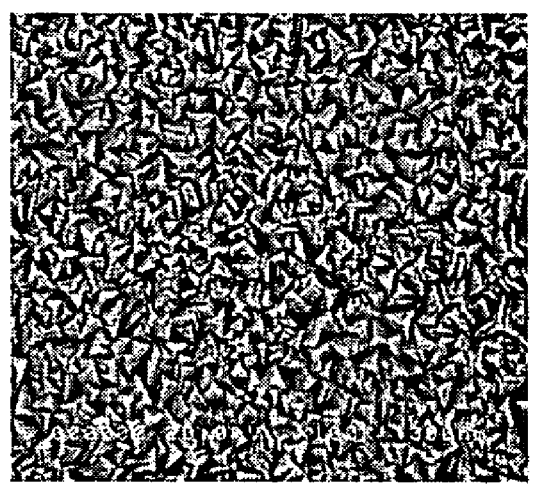
Figure 9:
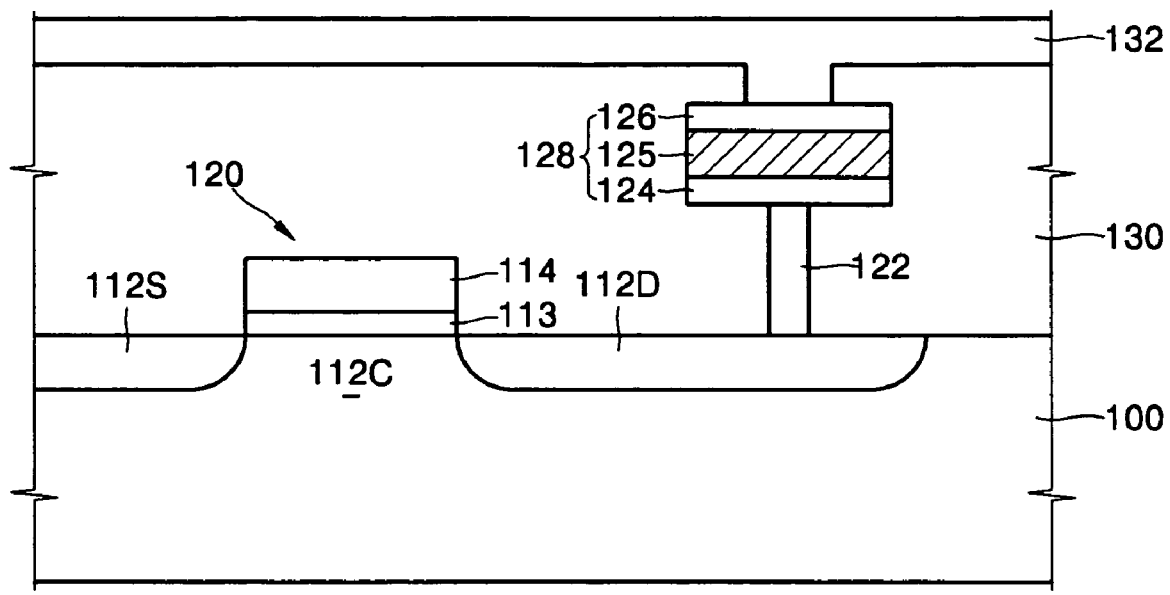

FIG. 7 is a graph showing the result of XRD analysis of an amorphous NiO thin film manufactured in the experiment according to example embodiments and FIG. 8 is a SEM image (a) of the surface of the amorphous NiO thin film prepared according to example embodiments. FIG. 8 also includes a SEM image (b) of a crystalline NiO thin film manufactured using a conventional sputtering method. FIG. 9 is a diagram illustrating a nonvolatile memory device that uses an amorphous NiO thin film manufactured according to example embodiments.

Referring to FIG. 9, the nonvolatile memory device may include a transistor switch 120 and a data storage unit 128 connected to the transistor switch 120 according to example embodiments. The transistor switch 120 may include a source 112s, a drain 112d, a channel 112c and a gate electrode 114.

The data storage unit 128 may include a first electrode 124, a second electrode 126 and an amorphous NiO thin film 125 interposed therebetween. The amorphous NiO thin film 125 may be formed using the aforementioned ALD process. An insulating layer 30 may be formed on the transistor switch 120 and the data storage unit 28 may be located in the insulating layer 130. The data storage unit 128 may be connected to the transistor switch 120 via a conductive contact plug 122. The amorphous NiO thin film 125 may have a reset state or a set state (refer to FIG. 6) according to the magnitude of a voltage applied thereto. The reset state and the set state may have different resistances. The storing and reading of binary information may be achieved using the resistance difference. The amorphous NiO thin film 125 may have a thickness of about 10 Å to about 499 Å. The first and second electrodes 124 and 126 may be formed of a metal (e.g., platinum (Pt) and/or any other suitable metal). The amorphous NiO thin film 125 may have a width of about 100 nm to about 1000 nm, for example, about 200 nm.

The amorphous NiO thin film 125 may have improved on-off characteristics at a smaller thickness (e.g., about 200 Å to about 300 Å) than a conventional polycrystalline NiO thin film. The use of the amorphous NiO thin film 125 in a non-volatile memory device may increase integration, reduce leakage current and improve the resistance characteristics of the nonvolatile memory device, thereby allowing a lower driving voltage of the nonvolatile memory device. According to example embodiments, an amorphous NiO thin film having improved switching behavior may be obtained by reducing a leakage current and improving resistance characteristics. The switching behavior of an amorphous NiO thin film may be improved even when thin, but also its thickness may be controlled more easily because it may be formed using ALD. When a non-volatile memory device is formed using the method of forming an amorphous NiO thin film, the integration of the nonvolatile memory device may be increased and the reset current required for writing and erasing data may be reduced.

The foregoing is illustrative of example embodiments and is not to be construed as limiting thereof. While example embodiments have been particularly shown and described, it will be understood by those of ordinary skill in the art that various changes in form and detail may be made therein without departing from the spirit and scope of the following claims.

What is claimed is:

1. A non-volatile memory device, comprising:
   a transistor switch that includes a source, a drain, a channel and a gate electrode; and
   a data storage unit that includes an amorphous NiO thin film interposed directly between a first electrode and a second electrode connected to the transistor switch,
   wherein the amorphous NiO thin film includes a plurality of sequentially formed monolayer NiO thin films.

2. The non-volatile memory device of claim 1, wherein the amorphous NiO thin film has a thickness of about 10 Å to about 499 Å.

3. The non-volatile memory device of claim 1, wherein the amorphous NiO thin film is formed using an atomic layer deposition (ALD) process.

4. The non-volatile memory device of claim 3, wherein the amorphous NiO thin film has a thickness of about 200 Å to about 300 Å.

5. The non-volatile memory device of claim 1, wherein the first and second electrodes are formed of a metal.

6. The non-volatile memory device of claim 5, wherein the metal is platinum Pt.

* * * * *